(12) United States Patent
Nussbaum

(10) Patent No.: US 9,172,359 B2
(45) Date of Patent: Oct. 27, 2015

(54) FLEXIBLE CHIRP GENERATOR

(71) Applicant: RAYTHEON COMPANY, Waltham, MA (US)

(72) Inventor: Howard S. Nussbaum, El Segundo, CA (US)

(73) Assignee: RAYTHEON COMPANY, Waltham, MA (US)

( * ) Notice: Subject to any disclaimer, the term of this patent is extended or adjusted under 35 U.S.C. 154(b) by 51 days.

(21) Appl. No.: 14/197,022

(22) Filed: Mar. 4, 2014

(65) Prior Publication Data

US 2015/0256162 A1  Sep. 10, 2015

(51) Int. Cl.
*H03B 28/00* (2006.01)
*H03K 5/06* (2006.01)
*H03K 5/01* (2006.01)

(52) U.S. Cl.
CPC .. *H03K 5/06* (2013.01); *H03K 5/01* (2013.01); *H03B 28/00* (2013.01)

(58) Field of Classification Search
CPC ......... H04M 1/505; H03B 28/00; H03L 7/16; G06F 1/0328; H03K 5/135; H03K 5/156
USPC .................................. 327/107–113; 708/271
See application file for complete search history.

(56) References Cited

U.S. PATENT DOCUMENTS

| | | | |
|---|---|---|---|
| 5,151,661 A * | 9/1992 | Caldwell et al. | 327/107 |
| 5,394,106 A * | 2/1995 | Black et al. | 327/107 |
| 6,614,813 B1 * | 9/2003 | Dudley et al. | 370/532 |
| 2005/0010625 A1 | 1/2005 | Andrews | |

FOREIGN PATENT DOCUMENTS

| | | |
|---|---|---|
| EP | 0 528 565 A2 | 2/1993 |
| EP | 0 528 565 B1 | 6/1996 |

OTHER PUBLICATIONS

Written Opinion of the International Searching Authority for International Application No. PCT/US2015/013384, filed Jan. 28, 2015, Written Opinion of the International Searching Authority mailed May 6, 2015 (6 pgs.).

International Search Report for International Application No. PCT/US2015/013384, filed Jan. 28, 2015, International Search Report dated Apr. 22, 2015 and mailed May 6, 2015 (4 pgs.).

* cited by examiner

*Primary Examiner* — John Poos
(74) *Attorney, Agent, or Firm* — Christie, Parker & Hale, LLP

(57) ABSTRACT

A processing-efficient chirp generator that allows flexibility in controlling phase, frequency and slope, i.e., rate of change of frequency. In one embodiment, a fine phase propagation block generates phase values in increments of the fine time step, each phase value also offset from other phase values by multiples of a coarse time step. The phase samples are realigned in time after conversion to digital-to-analog converter (DAC) values.

19 Claims, 5 Drawing Sheets

FLEXIBLE CHIRP GENERATOR

BACKGROUND

1. Field

One or more aspects of embodiments according to the present invention relate to chirp generators, and more specifically to a direct digital synthesis (DDS) chirp generator capable of responding to commands ds to change the slope, frequency or phase during operation.

2. Description of Related Art

Signal generators employing direct digital synthesis (DDS) may, in some applications, be composed of a digital circuit connected to a digital to analog converter (DAC). The digital circuitry of the digital to analog converter may operate at a clock rate that is a multiple, N, say, of the clock rate at which the digital circuit operates, and in this case the digital circuit may be required to generate N outputs per clock cycle which are then multiplexed into the DAC.

In the case of a chirp generator, i.e. a DDS system which generates a sinusoidal signal with a frequency that changes at a certain, e.g., piecewise constant, rate, the DAC may be driven from a set of sine tables, which in turn are indexed by phase produced by a double accumulator taking as input the chirp rate, which may also be referred to as the slope, i.e., the rate of change of frequency. In this configuration, the output of the first accumulator of the slope is the frequency, and the output of the second accumulator is the phase. When N samples are needed to be generated during each clock cycle, parallel versions of the double accumulator are employed where there is a separate double accumulator for each of the N samples constructed in a cycle. For this case, each double accumulator generates frequency and phase samples separated by N samples.

It may be advantageous for a chirp generator to have the capability to respond to commands to change the slope, frequency or phase during operation. With a conventional double accumulator, where the clock rate of the accumulator is the same as the DAC rate, responding to the command changes is easily implemented. Implementing this capability with parallel versions of the double accumulator, however, results in the need for a complex compensation scheme to maintain the desired analog output as commanded changes in slope, frequency, or phase take effect. Thus, there is a need for a simple system for generating a chirp by direct digital synthesis that is capable of responding to commands to change the slope, frequency or phase during operation and of generating N outputs per clock cycle.

SUMMARY

A processing-efficient chirp generator operating at 1/N the rate of the DAC that allows flexibility in controlling phase, frequency and slope, i.e., rate of change of frequency, includes, in one embodiment, a fine phase propagation block that generates phase values in increments of a fine time step (DAC rate), each phase value also offset from other phase values by multiples of a coarse time step (N DAC clocks). The phase samples are realigned in time after conversion to digital-to-analog converter (DAC) values.

According to an embodiment of the present invention there is provided a system for generating a sequence of sine wave output values separated by a fine time step, the system including: a fine time recursion block including a chain of fine phase propagation blocks, a plurality of the fine phase propagation blocks including: a slope input and a slope output; a frequency input and a frequency output; a phase input and a first phase output and a second phase output; a first adder, a second adder, each including a first input, a second input and an output; and a slope delay; wherein: the slope input is connected: through the slope delay to the slope output; and to a first input of the first adder; the frequency input is connected to the second input of the first adder; the output of the first adder is connected to the frequency output and to the first input of the second adder; the phase input is connected to the second input of the second adder; the output of the second adder is connected to the first phase output and to the second phase output; the slope output, a frequency output, and the first phase output of each of the plurality of fine phase propagation blocks connected to the slope input, the frequency input, and the phase input, respectively, of a subsequent fine phase propagation block in the chain; a plurality of sine generators, each sine generator having an input and an output, the inputs of the plurality of sine generators connected to the second phase outputs of the plurality of fine phase propagation blocks; and a plurality of delay blocks; each of the plurality of delay blocks having an input and an output, the inputs of the plurality of delay blocks being connected to the outputs of the plurality of sine generators.

In one embodiment, the plurality of sine generators includes a plurality of sine lookup tables.

In one embodiment, the slope delay includes an input and an output, and the output value is the input value delayed by a coarse time step.

In one embodiment, each of the plurality of delay blocks has a delay differing from a delay of another of the plurality of delay blocks by a coarse time step.

In one embodiment, the system includes a coarse time recursion block, the coarse time recursion block including a slope output, a frequency output, and a phase output, the slope output of the coarse time recursion block being connected to a slope input of the chain of fine phase propagation blocks, the frequency output of the coarse time recursion block being connected to a frequency input of chain of fine phase propagation blocks, and the phase output of the coarse time recursion block being connected to a phase input of the chain of fine phase propagation blocks.

In one embodiment, the coarse time recursion block includes a coarse frequency propagation stage.

In one embodiment, the coarse frequency propagation stage is configured to evaluate the equation $Fr((m+1)N)=Fr(mN)+N*Sl(mN)$, wherein $Fr(mN)$ and $Sl(mN)$ are a frequency and a slope, respectively, at a current time, N is the ratio of a coarse time step to the fine time step, and $Fr((m+1)N)$ is a frequency at a subsequent coarse time.

In one embodiment, N is an integral power of 2, and the coarse frequency propagation stage is configured to evaluate the term $N*Sl(mN)$ by performing a left shift of $Sl(mN)$ by an integral number of bits.

In one embodiment, the coarse frequency propagation stage includes a plurality of switches configured to select an operating mode from the group consisting of: a mode in which a frequency base is not altered, a mode in which the frequency base is modified, a mode in which slope effects on frequency are not used, a mode in which slope effects on frequency are used, a mode in which a frequency base is initialized, a mode in which normal accumulation of the frequency base occurs, a mode in which a frequency is not modified, a mode in which the frequency is modified with an input and a held value, and a mode in which the frequency is modified with a held value.

In one embodiment, the coarse time recursion block includes a coarse phase propagation stage.

In one embodiment, the coarse phase propagation stage is configured to evaluate the equation $Ph((m+1)N)=Ph(mN)+N*Fr(mN)+N(N+1)/2*Sl(mN)$, wherein $Ph(mN)$, $Fr(mN)$, and $Sl(mN)$ are a phase, a frequency, and a slope, respectively, at a current time step, N is the ratio of a coarse time step to the fine time step, and $Ph((m+1)N)$ is a phase at a subsequent coarse time.

In one embodiment, N is an integral power of 2, and the coarse phase propagation stage is configured to perform a multiplication by N/2, in evaluating the term $N(N+1)/2*Sl(mN)$, by performing a left shift of $Sl(mN)$ by an integral number of bits.

In one embodiment, the coarse phase propagation stage includes a plurality of switches configured to select an operating mode from the group consisting of: a mode in which a phase base is not altered, a mode in which the phase base is modified, a mode in which slope effects and frequency on phase are not used, a mode in which slope and frequency effects on phase are used, a mode in which a phase base is initialized, a mode in which normal accumulation of the phase base occurs, a mode in which a phase is not modified, a mode in which the phase is modified with an input and a held value, and a mode in which the phase is modified with a held value.

In one embodiment, the coarse time recursion block includes a coarse slope propagation stage.

In one embodiment, the coarse slope propagation stage includes a plurality of switches configured to select an operating mode from the group consisting of: a mode in which a slope base is not altered, a mode in which the slope base is modified, a mode in which a slope base is initialized, a mode in which the slope base is modified or retained, a mode in which a slope is not modified, a mode in which the slope is modified with an input and a held value, and a mode in which the slope is modified with a held value.

In one embodiment, the system includes a buffer connected to the outputs of the sine generators, the buffer having a buffer size, wherein the operation of the fine phase propagation blocks is configured to be gated by a clock, the clock being configured to halt when a portion of the buffer that is in use exceeds, in size, a threshold fraction of the buffer size.

In one embodiment, the system includes a slope control block, configured to hold a queue of slope commands, each slope command including an activation time, a plurality of parameters, and a plurality of switch settings, connected to a slope accumulator; a frequency control block, configured to hold a queue of frequency commands, connected to a frequency accumulator, each frequency command including an activation time, a plurality of parameters, and a plurality of switch settings; and a phase control block, configured to hold a queue of phase commands, each phase command including an activation time, a plurality of parameters, and a plurality of switch settings, connected to a phase accumulator, wherein the clock is distributed to each of the slope control block, the frequency control block, and the phase control block with a respective delay matching a delay in a respective accumulator block.

In one embodiment, the operation of the sine generators is configured to be gated by the clock.

In one embodiment, the system includes a coarse time recursion block configured to be gated by the clock.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a flexible chirp generator provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
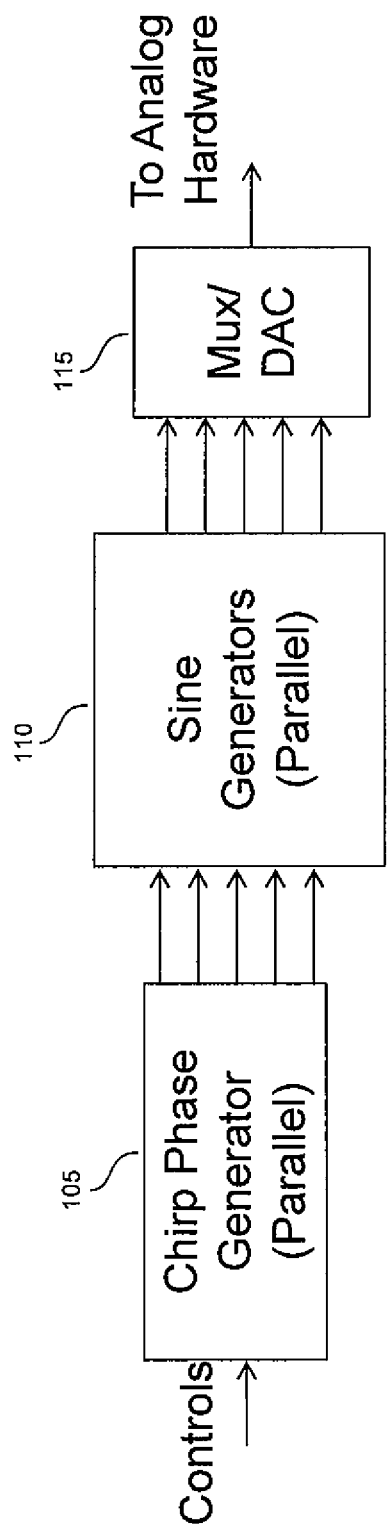
FIG. 1 is a block diagram of a flexible chirp generator according to an embodiment of the present invention.

Referring to FIG. 1, in one embodiment, a flexible chirp generator includes three principal blocks: a digital chirp phase generator 105, a bank of digital sine generators 110, and a multiplexer and digital to analog converter (a Mux/DAC block) 115. The output of the Mux/DAC block is an analog signal that may have a higher sampling rate than the clock rates of the digital chirp phase generator 105 and the digital sine generators 110. For example, the digital chirp phase generator 105 and the digital sine generators 110 may be implemented in an FPGA with a clock rate of 100 MHz and the Mux/DAC block may generate analog output with a sampling rate of 1.6 GHz. The sine generator 110 may include various delays to appropriately form the input to block 115. The time steps corresponding to the higher sampling rate are referred to herein as fine time steps, and the time steps corresponding to the lower clock rate of the digital chirp phase generator 105 and the digital sine generators 110 are referred to as coarse time steps. The length of a coarse time step may be an integer multiple of the length of a fine time step, where the integer is referred to as N, and, as in the example above, N may be 16. To supply a sufficient volume of data to the Mux/DAC block, the digital chirp phase generator 105 and the digital sine generators 110 may operate with multiple, e.g., 16, parallel data paths, generating N data values in each coarse time step, which are then multiplexed into a higher sampling rate analog signal by the Mux/DAC block.

At each coarse time step, the digital chirp phase generator 105 produces N phase values, which are converted to N digital sine values by a bank of parallel sine generators. Each sine generator may for example be a lookup table producing a digital value approximately equal to the sine of the phase input or other representation needed as an input to the DAC. In other embodiments the output may instead approximate a cosine of the phase input or a linear combination of the sine of the phase input and the cosine of the phase input, or it may, instead of being generated by a lookup table, be generated by another method such as an algorithm used to calculate a sine or a cosine.

Figure 2:
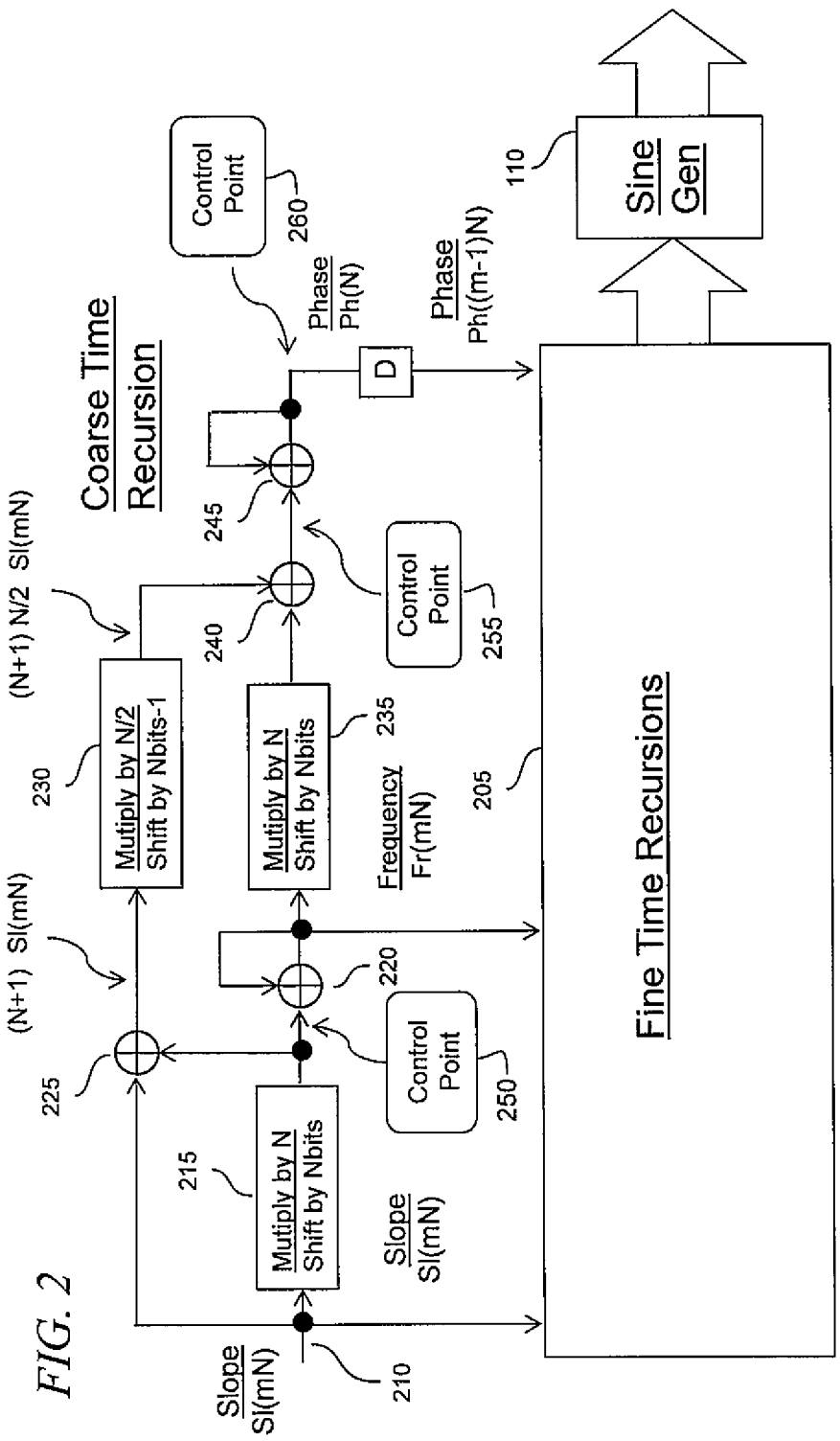
FIG. 2 is a block diagram of a flexible chirp generator showing details of a coarse time recursion block according to an embodiment of the present invention.

Referring to FIG. 2, in one embodiment the phase values are generated by two blocks referred to as a coarse time recursion block and a fine time recursion block 205. In each coarse time step, the coarse time recursion block generates, in two stages referred to as a coarse frequency propagation stage and a coarse phase propagation stage, a frequency Fr(mN), and a phase Ph(mN), respectively. The rate of change of frequency, which is referred to as the slope Sl(mN), is an input to these stages. Coarse propagation is determined by a coarse frequency propagation equation:

$$Fr((m+1)N)=Fr(mN)+N*Sl(mN),$$

and a coarse phase propagation equation:

$$Ph((m+1)N)=Ph(mN)+N*Fr(mN)+N(N+1)/2*Sl(mN),$$

where m is an integer representing the current value of the coarse time step. The coarse propagation equation differs from the parallel version based on a conventional double accumulator by N*Sl(mN). For conventional parallel double accumulators, Ph((m+1)N)=Ph(mN)+N*Fr(mN)+N(N−1)/2*Sl(mN), which makes input changes complex to implement.

In a digital circuit, the evaluation of these equations may be performed according to the implementation illustrated in FIG. 2. The slope Sl(mN) is supplied at an external input 210. To evaluate the coarse frequency propagation equation, the slope Sl(mN) is multiplied by N in a multiplier 215 to form the quantity N*Sl(mN), and added to the current value of the frequency by the frequency accumulator 220, to form Fr(mN)+N*Sl(mN), which is the next value of the frequency, i.e., Fr((m+1)N). If the ratio N of the coarse time step to the fine time step is a power of two, then it may be written N=2^Nbits, i.e., N may be written as 2 raised to the power of Nbits, and multiplication by N may be accomplished by a left shift of Nbits bits of Sl(mN), which is computationally inexpensive.

To evaluate the coarse phase propagation equation, the quantity (N+1)*Sl(mN) is formed by adding, in an adder 225, the quantity Sl(mN) to the quantity N*Sl(mN), which is formed in the evaluation of the coarse frequency propagation equation. The quantity (N+1)*Sl(mN) is then multiplied by N/2 in multiplier 230, e.g., by left-shifting by Nbits−1 Sl(mN) if N is a power of 2, to form the quantity N(N+1)/2*Sl(mN). The quantity N*Fr(mN) is formed by multiplying, in multiplier 235, the frequency by N (by left-shifting by Nbits Fr(mN), if N is a power of 2). The quantity N*Fr(mN) is then added to the quantity N(N+1)/2*Sl(mN) by adder 240, to form the quantity N*Fr(mN)+N(N+1)/2*Sl(mN). Finally the current value of the phase, Ph(mN) is added, in adder 245. This forms the next value of the phase, Ph((m+1)N). The quantity Ph((m−1)N) needed by the fine time recursion block 205 is formed by delaying Ph(mN) by one coarse time step in delay D, also referred to herein as the slope delay.

Figure 5:
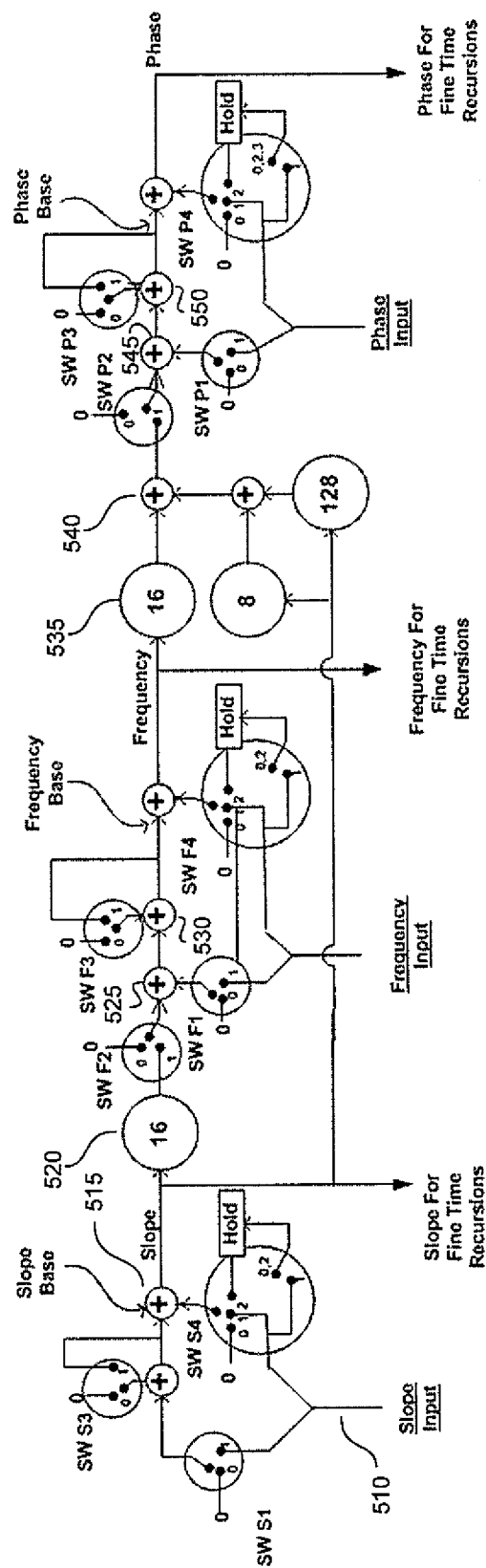
FIG. 5 is a block diagram of a coarse time recursion block emphasizing the control aspects of an embodiment of the present invention.

At each of several control points 250, 255, 260, the value of the frequency and phase may be altered, e.g., overwritten or otherwise modified, by external control inputs, as desired, for example as described in greater detail with respect to the embodiment of FIG. 5.

Figure 3:
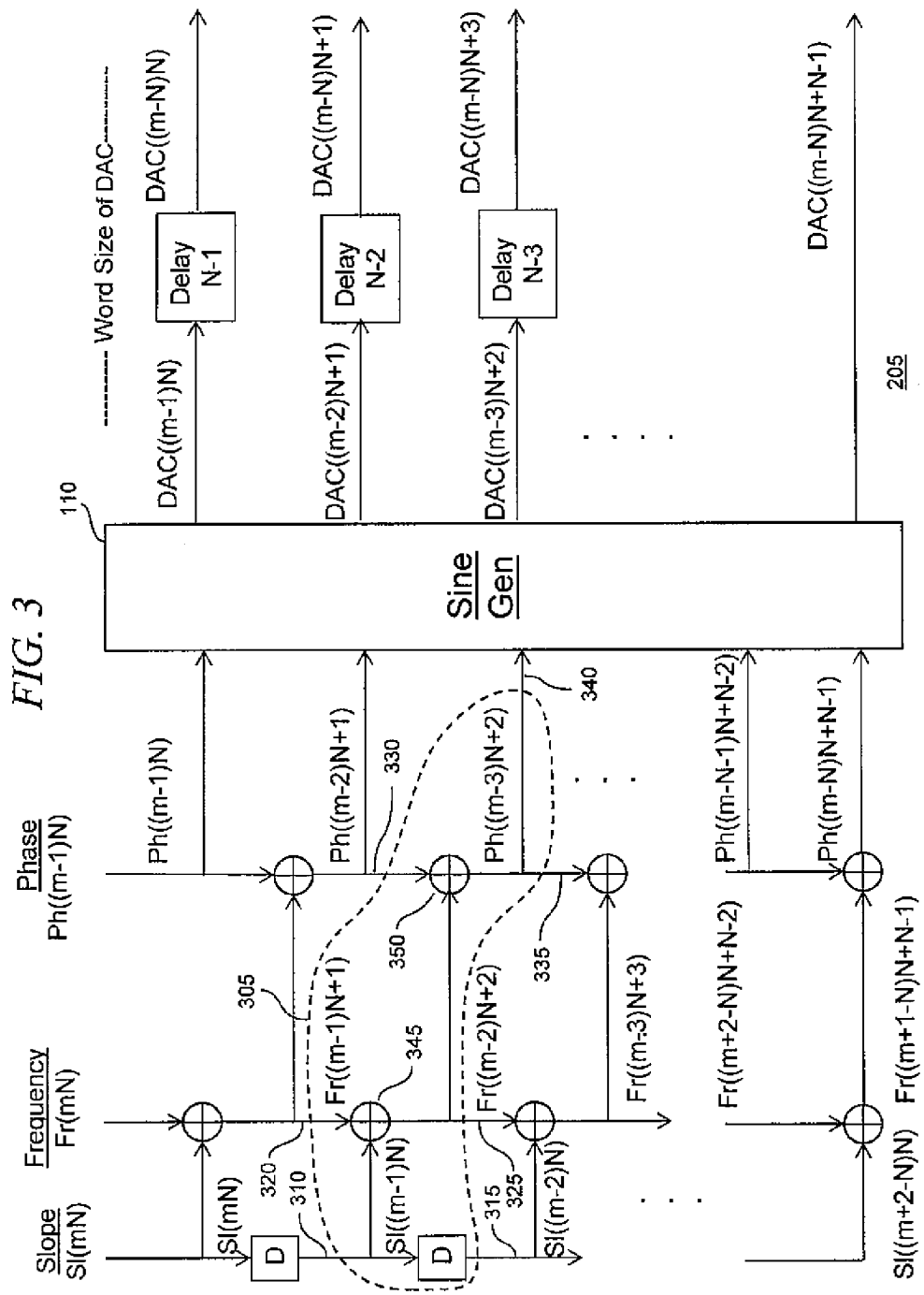
FIG. 3 is a block diagram showing details of a fine time recursion block according to an embodiment of the present invention.

As used herein, a "fine time recursion block" refers to a block that generates a sequence of phase values at different fine time steps using as input one of, or a combination of, a slope input, a frequency input, and a phase input. Fine propagation is performed, in one embodiment illustrated in FIG. 3, according to a fine frequency propagation equation:

$$Fr(mN+n)=Fr(mN+n-1)+Sl(mN),$$

and a fine phase propagation equation:

$$Ph(mN+n)=Ph(mN+n-1)+Fr(mN+n),$$

where n is an integer representing the current value of the fine time step. The current slope Sl(mN), the current frequency Fr(mN) and the delayed phase Ph((m−1)N) are fed into the fine time recursion block from the coarse time recursion block. The evaluation of this set of recurrence equations is performed by unfolding the equations and having separate implementations for each n. For each value of n, the fine frequency propagation equation and the fine phase propagation equation may be evaluated by a an efficient fine phase propagation block 305 with no multipliers, which has three inputs and four outputs, and includes two adders and a delay, the inputs and outputs including a slope input 310 and a slope output 315, a frequency input 320 and a frequency output 325, and a phase input 330, a first phase output 335 and a second phase output 340. As used herein, a "fine phase propagation block" refers to a block that generates as output the phase at a fine time step, using as input one of, or a combination of, a slope input, a frequency input, and a phase input. The slope input 310 is delayed by one coarse time step by a delay block D, and connected to the slope output 315. The value at the frequency input 320 is added in a first adder 345 to the value at the slope input 310, and the result is sent to the frequency output 325, and also added, in a second adder 350, to the value at the phase input 330. The output of the second adder 350 is sent to both the first phase output 335 and the second phase output 340.

N−1 of these unfolded fine phase propagation blocks 305 are, in one embodiment, chained together, with the slope output, the frequency output, and the first phase output of the first N−2 of the fine phase propagation blocks 305 connected to the slope input, the frequency input, and the phase input, respectively, of a subsequent fine phase propagation block 305 in the chain. The slope output, the frequency output, and the first phase output of the last fine phase propagation block 305 in the chain are unused, and the slope input, the frequency input, and the phase input of the first fine phase propagation block 305 in the chain are connected to the external slope input, frequency input, and phase input of the fine time recursion block 205.

The phase input of the fine time recursion block 205 is Ph((m−1)N), the second phase output of the first fine phase propagation block 305 in the chain is Ph((m−2)N+1), the second phase output of the second fine phase propagation block 305 in the chain is Ph((m−3)N+2), and so on, i.e., the second phase output of each fine phase propagation block 305 in the chain is the phase at a time that is earlier than that of the preceding fine phase propagation block 305 in the chain by one coarse time step and later by one fine time step.

This sequence of N phase values may be converted into a series of N DAC values by a bank of parallel sine generators, which may for example be sine lookup tables. The DAC values may then be delayed in increments of the coarse time step so that the coarse time of each delayed DAC value is the same, and the fine time of the N DAC values ranges from 1 to N in increments of 1. In particular, the output of the sine generators may be written DAC((m−1)N), DAC((m−2)N+1), DAC((m−3)N+2), . . . DAC((m−N)N+N−1), and the delayed DAC values, which are delayed by N−1, N−2, etc., coarse time steps, i.e., (N−1)N, (N−2)N, etc. fine time steps, may be written DAC ((m−N)N), DAC((m−N)N+1), DAC((m−N)N+2), . . . DAC ((m−N)N+N−1). Having been aligned in coarse time, this sequence of N DAC values separated in time by increments of one fine time step represents the desired set of N analog output samples during one coarse time step.

In another embodiment, each of the N phase values may be delayed, in increasing increments of the coarse time step, instead of delaying the DAC values. This may however require that the system include more memory to perform the delaying operation, if each phase value requires more memory to store it than the corresponding DAC value.

Figure 4:
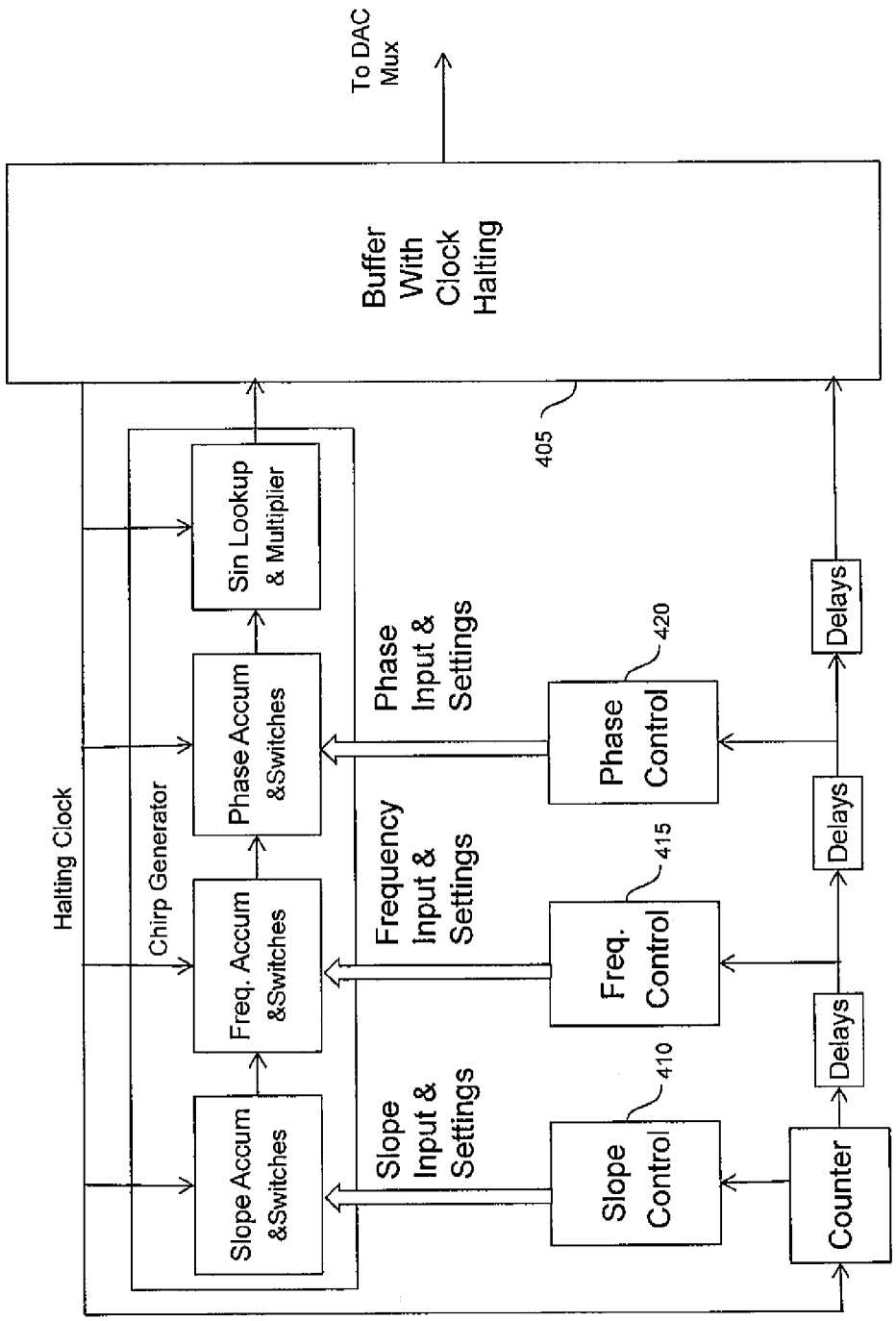
FIG. 4 is a block diagram of a flexible chirp generator illustrating an implementation including a halting clock according to an embodiment of the present invention.

Referring to FIG. 4, in one embodiment, a buffer 405 is included between the sine generator and the Mux/DAC to temporarily store the output of the sine generators. If this buffer becomes full, or the size of the portion of the buffer that is in use exceeds a threshold fraction of the buffer size, operation of the digital chirp phase generator 105 and of the digital sine generators 110 may be halted. This may be accomplished by using a halting clock to gate the digital chirp phase generator 105 and the digital sine generators 110, and implementing a circuit that halts this clock when the buffer is full or nearly full. The same halting clock may also be used to control the flow of commands in each of three control blocks, a slope control block 410, a frequency control block 415, and a phase control block 420. Each of these control blocks 410, 415, 420, may be configured to hold a queue of commands, each command including an activation time, and the values of control switch settings and other control inputs to be used when the command is activated. A counter is incremented by the halting clock and is distributed to the control blocks with the appropriate delay to match the accumulator blocks. When the counter matches an activation time of a command in one of the queues of commands, the associated action occurs, e.g., the switch settings are put into effect.

FIG. 5 illustrates how switch settings may be used to implement a slope control command, a frequency control command, or a phase control command, in a coarse time recursion block according to one embodiment, in which N=16. The slope input 510 is connected to two switches S1 and S4. Switch S1 selects between operating modes including not altering the slope base, and initializing or modifying the slope base. The output of switch S1 is connected to an accumulator switched by S3 as shown. Switch S3 selects between operating modes including initializing the slope base, and modifying or retaining the slope base. The output of the accumulator, i.e., the slope base, is then added, in an adder 515 to the output of switch S4, which selects between operating modes including not modifying the slope, modifying the slope with the input and a held value, and modifying the slope with a held value. The slope value is fed to the fine time recursion block, and also to a multiplier 520, which multiplies by 16 by performing a left shift of 4 bits. Switch F2 selects between modes including not using slope effects on frequency, and frequency base normal accumulation. The value at the output of switch F2 is added, by adder 525, to the output of switch F1, which selects between modes including not altering the frequency base, and initializing or modifying the frequency base. At the output of adder 525, another adder 530 together with switch F3 forms a switched accumulator, the output of which forms the frequency base. Switch F3 selects between modes including initializing the frequency base and frequency base normal accumulation. The output of switch F4 is added to the frequency base, so that switch F4 selects between modes including not modifying the frequency, modifying the frequency with input and the held value, and modifying the frequency with the held value.

The frequency output is then fed to the fine time recursion block, as well as to a multiplier 535 that multiplies by 16 by performing a left shift of 4 bits. The output of the multiplier 535 is added, in an adder 540, to the sum of the outputs of two multipliers, each taking as input the slope output, one multiplying by 8 and the other by 128, by performing left shifts of 3 and 7 bits respectively.

Switch P2 selects between modes including not using slope and frequency effects on the phase base, and using slope and frequency effects on the phase base. The value at the output of switch P2 is added, by adder 545, to the output of switch P1, which selects between modes including not altering the phase base, and initializing or modifying the phase base. At the output of adder 545, another adder 550 together with switch P3 forms a switched accumulator, the output of which forms the phase base. Switch P3 selects between modes including initializing the phase base and phase base normal accumulation. The output of switch P4 is added to the phase base, so that switch P4 selects between modes including not modifying the phase, modifying the phase with input and the held value, and modifying the phase with the held value.

Although limited embodiments of a flexible chirp have been specifically described and illustrated herein, many modifications and variations will be apparent to those skilled in the art. Accordingly, it is to be understood that a flexible chirp generator employed according to principles of this invention may be embodied other than as specifically described herein. The invention is also defined in the following claims, and equivalents thereof.

What is claimed is:

1. A system for generating a sequence of sine wave output values separated by a fine time step, the system comprising:
   a fine time recursion block comprising a chain of fine phase propagation blocks,
   a plurality of the fine phase propagation blocks comprising:
      a slope input and a slope output;
      a frequency input and a frequency output;
      a phase input and a first phase output and a second phase output;
      a first adder, a second adder, each comprising a first input, a second input and an output; and
      a slope delay;
   wherein:
      the slope input is connected:
         through the slope delay to the slope output; and
         to a first input of the first adder;
      the frequency input is connected to the second input of the first adder;
      the output of the first adder is connected to the frequency output and to the first input of the second adder;
      the phase input is connected to the second input of the second adder;
      the output of the second adder is connected to the first phase output and to the second phase output;
   the slope output, a frequency output, and the first phase output of each of the plurality of fine phase propagation blocks connected to the slope input, the frequency input, and the phase input, respectively, of a subsequent fine phase propagation block in the chain;
   a plurality of sine generators, each sine generator having an input and an output, the inputs of the plurality of sine generators connected to the second phase outputs of the plurality of fine phase propagation blocks; and
   a plurality of delay blocks; each of the plurality of delay blocks having an input and an output, the inputs of the plurality of delay blocks being connected to the outputs of the plurality of sine generators.

2. The system of claim 1, wherein the plurality of sine generators comprises a plurality of sine lookup tables.

3. The system of claim 1, wherein the slope delay comprises an input and an output, and wherein the output value is the input value delayed by a coarse time step.

4. The system of claim 1, wherein each of the plurality of delay blocks has a delay differing from a delay of another of the plurality of delay blocks by a coarse time step.

5. The system of claim 1, comprising a coarse time recursion block, the coarse time recursion block comprising a slope output, a frequency output, and a phase output, the slope output of the coarse time recursion block being connected to a slope input of the chain of fine phase propagation blocks, the frequency output of the coarse time recursion block being connected to a frequency input of chain of fine phase propagation blocks, and the phase output of the coarse time recursion block being connected to a phase input of the chain of fine phase propagation blocks.

6. The system of claim 5, wherein the coarse time recursion block comprises a coarse frequency propagation stage.

7. The system of claim 6, wherein the coarse frequency propagation stage is configured to evaluate the equation $Fr((m+1)N)=Fr(mN)+N*Sl(mN)$, wherein $Fr(mN)$ and $Sl(mN)$ are a frequency and a slope, respectively, at a current time, N is the ratio of a coarse time step to the fine time step, and $Fr((m+1)N)$ is a frequency at a subsequent coarse time.

8. The system of claim 7, wherein N is an integral power of 2, and the coarse frequency propagation stage is configured to evaluate the term $N*Sl(mN)$ by performing a left shift of $Sl(mN)$ by an integral number of bits.

9. The system of claim 6, wherein the coarse frequency propagation stage comprises a plurality of switches configured to select an operating mode from the group consisting of a mode in which a frequency base is not altered, a mode in which the frequency base is modified, a mode in which slope effects on frequency are not used, a mode in which slope effects on frequency are used, a mode in which the frequency base is initialized, a mode in which normal accumulation of the frequency base occurs, a mode in which a frequency is not modified, a mode in which the frequency is modified with an input and a held value, and a mode in which the frequency is modified with a held value.

10. The system of claim 5, wherein the coarse time recursion block comprises a coarse phase propagation stage.

11. The system of claim 10, wherein the coarse phase propagation stage is configured to evaluate the equation $Ph((m+1)N)=Ph(mN)+N*Fr(mN)+N(N+1)/2*Sl(mN)$, wherein $Ph(mN)$, $Fr(mN)$, and $Sl(mN)$ are a phase, a frequency, and a slope, respectively, at a current time step, N is the ratio of a coarse time step to the fine time step, and $Ph((m+1)N)$ is a phase at a subsequent coarse time.

12. The system of claim 11, wherein N is an integral power of 2, and the coarse phase propagation stage is configured to perform a multiplication by N/2, in evaluating the term $N(N+1)/2*Sl(mN)$, by performing a left shift of $Sl(mN)$ by an integral number of bits.

13. The system of claim 10, wherein the coarse phase propagation stage comprises a plurality of switches configured to select an operating mode from the group consisting of: a mode in which a phase base is not altered, a mode in which the phase base is modified, a mode in which slope effects and frequency on phase are not used, a mode in which slope and frequency effects on phase are used, a mode in which the phase base is initialized, a mode in which normal accumulation of the phase base occurs, a mode in which a phase is not modified, a mode in which the phase is modified with an input and a held value, and a mode in which the phase is modified with a held value.

14. The system of claim 5, wherein the coarse time recursion block comprises a coarse slope propagation stage.

15. The system of claim 14, wherein the coarse slope propagation stage comprises a plurality of switches configured to select an operating mode from the group consisting of: a mode in which a slope base is not altered, a mode in which the slope base is modified, a mode in which the slope base is initialized, a mode in which the slope base is modified or retained, a mode in which a slope is not modified, a mode in which the slope is modified with an input and a held value, and a mode in which the slope is modified with a held value.

16. The system of claim 1, comprising a buffer connected to the outputs of the sine generators, the buffer having a buffer size, wherein the operation of the fine phase propagation blocks is configured to be gated by a clock, the clock being configured to halt when a portion of the buffer that is in use exceeds, in size, a threshold fraction of the buffer size.

17. The system of claim 16, comprising:
a slope control block, configured to hold a queue of slope commands, each slope command comprising an activation time, a plurality of parameters, and a plurality of switch settings, connected to a slope accumulator;
a frequency control block, configured to hold a queue of frequency commands, connected to a frequency accumulator, each frequency command comprising an activation time, a plurality of parameters, and a plurality of switch settings; and
a phase control block, configured to hold a queue of phase commands, each phase command comprising an activation time, a plurality of parameters, and a plurality of switch settings, connected to a phase accumulator,
wherein the clock is distributed to each of the slope control block, the frequency control block, and the phase control block with a respective delay matching a delay in a respective accumulator block.

18. The system of claim 16, wherein the operation of the sine generators is configured to be gated by the clock.

19. The system of claim 18, comprising a coarse time recursion block configured to be gated by the clock.

* * * * *